June 18, 1957 S. G. ELLIS ET AL 2,796,562

SEMICONDUCTIVE DEVICE AND METHOD OF FABRICATING SAME

Filed June 2, 1952

INVENTOR.
Jacques I. Pantchechnikoff & Sidney G. Ellis

BY J. C. Whittaker
ATTORNEY 2,796,562

SEMICONDUCTIVE DEVICE AND METHOD OF FABRICATING SAME

Sidney G. Ellis, Princeton Junction, and Jacques I. Pantchechnikoff (now by change of name Jacques Isaac Pankove), Princeton, N. J., assignors to Radio Corporation of America, a corporation of Delaware Application June 2, 1952, Serial No. 291,350

6 Claims. (Cl. 317—234)

This invention relates generally to semiconductive devices and more particularly to improved methods of and means for fabricating and for stabilizing the characteristics of junction type semiconductive devices.

The characteristics of semiconductor devices are very strongly dependent upon conditions existing at the surface of the semiconductor material. It is known, for example, that water vapor lowers the impedance of contacts to or junctions in a semiconductive material such as germanium and results in an appreciable loss in gain by the device. In junction type devices the protection of the exposed portion of the rectifying barrier is especially important. In addition to the sensitivity of the barrier to moisture, expansion or contraction of the material within which the semiconductive device is encased or "potted" may cause deformation of the junction metal and result in a reduction of the barrier impedance or even in a short-circuit thereof. Also, in P–N type junction devices, during the diffusion process, it has been found that impurity electrode materials diffuse along the surface of the semiconductor material. This surface diffusion requires that the device subsequently be etched to more clearly define the junction.

An object of the present invention is to provide an improved method for fabricating semiconductive devices.

Another object of the invention is to provide an improved method of controlling surface diffusion during fabrication of junction type semiconductive devices.

Another object of the invention is to provide an improved semiconductive device.

A still further object of the invention is to provide an improved method for protecting the junctions of semiconductive devices.

According to the present invention, the prior art disadvantages heretofore mentioned are avoided in the following manner. After a block of semiconductive material has been suitably prepared by an etching process, a mask of predetermined size and shape is placed thereon. A thin, coherent, high resistivity, substantially chemically inert film is deposited over the entire face of the semiconductor adhering thereto except whereon the mask is disposed. The mask is then removed and a pellet of material which will yield the desired impurity in the semiconductor is diffused into the semiconductor over the area that had previously been masked.

Figure 1:
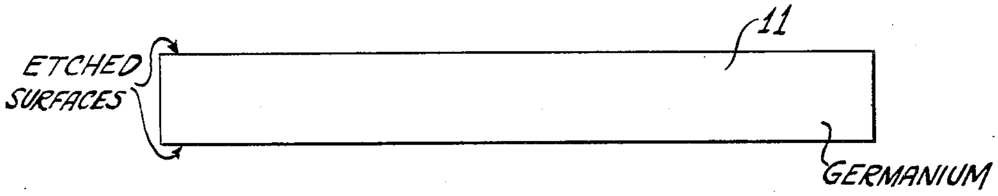
Figure 2:
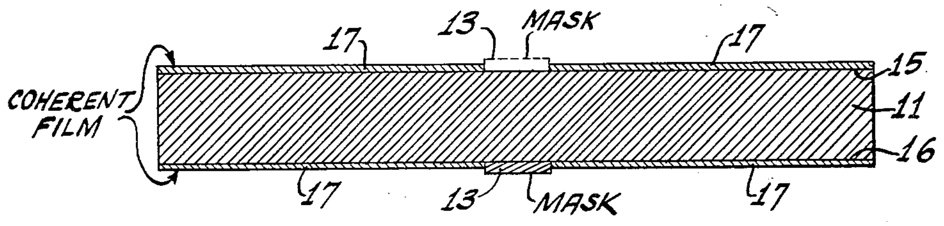
Figure 3:
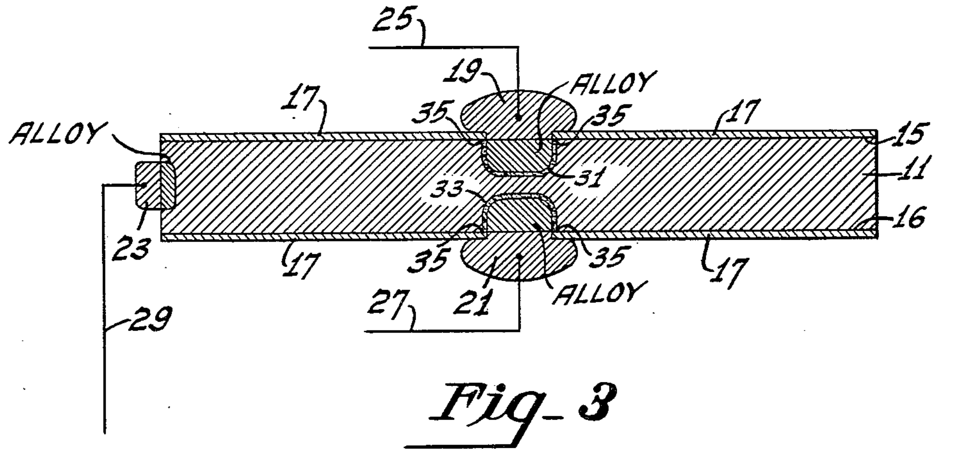

The invention will be described in greater detail with reference to the accompanying drawing in which Figures 1 through 3 are schematic diagrams illustrative of the method of fabricating and protecting semiconductive devices, according to the invention.

Similar reference characters are applied to similar elements throughout the drawing.

Referring to Figure 1 of the drawing, a block of semiconductive material such as germanium, silicon, or the like is indicated at 11. In the present example it will be assumed that the material is germanium and if of N-type conductivity. Initially the block of germanium 11 is etched in a solution comprising 4 cc. of hydrofluoric acid, 2 cc. of concentrated nitric acid, and 200 milligrams of cupric nitrate in 4 cc. of water. After etching, the semiconductor is washed with distilled water at room temperature and dried in a blast of hot dust-free air, the air being at a temperature of approximately 60° C.

Referring to Figure 2, a mask 13 of selected size and shape is then placed on one face 15 of the germanium block 11. The mask may comprise, for example, a disk of copper, stainless steel, or mica. The mask configuration is chosen to correspond to the electrode shape subsequently desired and the mask material is chosen so that it does not react chemically with the germanium. A protective material such, for example, as silicon monoxide, silicon dioxide, or magnesium fluoride is then vacuum evaporated in proximity to the masked semiconductor face 15 such that, upon condensation, the evaporated material forms a coherent film 17 which adheres thereto. It is emphasized that the film also may be applied to the face of the semiconductor block by other methods or techniques. The film preferably is very thin and may be of the order of 4000 angstrom units in thickness. The disk 13 is then removed and may be placed on the opposite face 16 of the semiconductor and the evaporation process repeated whereby a second protective film 17 is deposited on the semiconductor face 16.

Referring to Figure 3, and after the disk 13 has been removed from contact with the face 16, a pellet 19 of material, which as an impurity in germanium gives the latter P-type conductivity, is placed in contact with the portion of one of the semiconductor faces 15 which was masked during evaporation. Suitable material yielding this conductivity characteristic include, by way of example, boron, indium, gallium, and aluminum. It is pointed out, however, that if it is desirable to use a P-type semiconductor material, the impurity diffusion materials must be chosen to yield the opposite, or N-type, conductivity. Such diffusion materials include, for example, arsenic, antimony, and bismuth.

The ensemble is then heated in a reducing atmosphere at a temperature of approximately 200° C. for one minute so that the pellet 19 "wets" the germanium. A second pellet 21 is then placed in contact with the previously masked portion of the opposite face 16 of the semiconductor. Also a pellet 23 of tin is placed in contact with the body of the germanium at some other exposed point, such as an edge and the unit is heated in a reducing atmosphere at 400° C. to 500° C. for ten to twenty minutes whereby atoms from all three pellets 19, 21 and 23 are diffused into the germanium. Terminal leads 25, 27, and 29 may then be soldered or otherwise joined to the pellets 19, 21, 23 by well known techniques. For example, the leads 25, 27, and 29 may be coated with Wood's metal and pressed on to the surfaces where contact is desired, and the unit heated to about 100° C. whereby the leads are suitably connected to the device.

As a result of the diffusion of atoms from pellets 19 and 21, rectifying barriers 31 and 33, greatly exaggerated in size for purposes of illustration, are established at the junction of the pellet 19 to the block 11 and at the junction of the block 11 to the pellet 21. The pellet of tin 23, however, forms a low resistance non-rectifying contact to the block 11.

As mentioned previously, the portions 35 of these junctions which are exposed at the surface of the block 11 require protection to stabilize the physical conditions at these critical regions. The films 17 afford such protection. The criteria to be observed in selecting the film materials are: (1) the material should not react chemically either with the junction or with the atmosphere, (2) it should be of high resistivity, (3) high dielectric strength (of the order of 100 kilovolts per centimeter), (4) it must form a coherent film which readily adheres to the surface upon which it is condensed, (5) the film material should have a melting point of the order of 950° C. or greater, (6) the film must not granulate when subjected to the higher temperatures encountered in later steps in the fabrication of the device, and (7) it should have a high moisture rejection characteristic.

It will be seen that the film thus deposited restricts the surface diffusion of the pellet such that it is not necessary to etch the unit after the diffusion process. Furthermore, the mask configuration may be suitably chosen whereby the impurities diffused from the pellets assume a distribution having a corresponding configuration. Since the protective film is disposed over the entire face of the semiconductor, except where junctions have been made, it is clear that the junction or junctions are adequately protected from moisture and the like and conditions at the surface of the device are stabilized. The resistivity of the film is chosen sufficiently great that it does not short-circuit the junction or reduce its back impedance. Finally, during the subsequent "potting" of the device in a plastic or other material, the impedance of the junction is unaffected by deformation of the pellets which may be caused by mechanical stress or strain.

Devices fabricated in accordance with the foregoing method have exhibited certain improved characteristics not present in devices of the prior art. First, the junction or junctions of the device are protected from the time of the establishment thereof. Secondly, the physical properties of the film maintain the junction barrier impedance substantially constant when the device subsequently is encased or molded in a plastic material which is subject to thermal expansion or contraction. Also, the configuration of the mask utilized in the film evaporation process affords a means for defining the area of contact between the semiconductor block and the impurity diffusing pellets. Lastly, the presence of the film has prevented surface diffusion heretofore described and has alleviated the necessity of subsequently etching the device to define the junction boundary.

What is claimed is:

1. A circuit element comprising a solid semiconductor, an electrode diffused into a portion of one surface of said semiconductor, a rectifying junction associated with said electrode and having peripheral portions disposed upon the surface of said semiconductor, and a high resistivity adherent and coherent film having a relatively high melting point disposed over the portions of said surface adjacent said electrode for protecting critical portions of said surface, said film extending over and covering said peripheral portions of said junction.

2. A circuit element comprising a solid semiconductor, an electrode diffused into a portion of one surface of said semiconductor, and a high resitivity adherent and coherent film disposed over the portions of said semiconductor surface adjacent said electrode, said film having a melting point greater than 950° centigrade and a dielectric strength of the order of 100 kilovolts per centimeter.

3. A circuit element comprising a solid semiconductor, an electrode diffused into a portion of one surface of said semiconductor, and a high resistivity adherent and coherent film disposed in an intimate contact with the remaining portions of said semiconductor surface, said film having a melting point greater than 950° centigrade and a high moisture rejection characteristic for protecting critical portions of said surface.

4. A circuit element comprising a solid semiconductor, an electrode diffused into a portion of one surface of said semiconductor, and a high resistivity relatively high melting point adherent and coherent film disposed over the remaining portions of said semiconductor surface, said film material being selected from the class consisting of silicon monoxide, silicon dioxide, and magnesium fluoride.

5. A circuit element comprising a solid semiconductor, an electrode diffused into a portion of one surface of said semiconductor, and a silicon monoxide film disposed over portions of said semiconductor surface adjacent said electrode.

6. A circuit element comprising a body of semiconducting material, an electrode on a surface of said body, a P–N rectifying junction exposed on said surface adjacent said electrode, and an adherent and coherent film of a substance of high resistivity disposed on said junction.

References Cited in the file of this patent

UNITED STATES PATENTS

| | | |
|---|---|---|
| 2,367,978 | Troy | Jan. 23, 1945 |
| 2,396,979 | Baldwin | Mar. 19, 1946 |
| 2,473,887 | Jennings | June 21, 1949 |
| 2,524,033 | Bardeen | Oct. 3, 1950 |
| 2,560,594 | Pearson | July 17, 1951 |
| 2,561,411 | Pfann | July 24, 1951 |
| 2,563,503 | Wallace | Aug. 7, 1951 |
| 2,569,347 | Shockley | Sept. 25, 1951 |
| 2,592,683 | Gray | Apr. 15, 1952 |
| 2,680,220 | Starr et al. | June 1, 1954 |
| 2,684,457 | Lingel | July 20, 1954 |

FOREIGN PATENTS

| | | |
|---|---|---|
| 124,667 | Australia | July 3, 1947 |